(12) United States Patent
Okada et al.

(10) Patent No.: US 10,930,876 B2
(45) Date of Patent: Feb. 23, 2021

(54) LIGHT-EMITTING DEVICE

(71) Applicant: PIONEER CORPORATION, Tokyo (JP)

(72) Inventors: Takeru Okada, Kawasaki (JP); Ayako Yoshida, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/660,583

(22) Filed: Oct. 22, 2019

(65) Prior Publication Data
US 2020/0052238 A1 Feb. 13, 2020

Related U.S. Application Data

(63) Continuation of application No. 16/081,872, filed as application No. PCT/JP2016/056674 on Mar. 3, 2016, now Pat. No. 10,497,892.

(51) Int. Cl.
*H01L 51/52* (2006.01)
*H01L 51/50* (2006.01)
(Continued)

(52) U.S. Cl.
CPC .......... *H01L 51/5203* (2013.01); *H01L 51/50* (2013.01); *H01L 51/5064* (2013.01);
(Continued)

(58) Field of Classification Search
CPC ............ H01L 51/5203; H01L 51/5275; H01L 51/5064; H01L 51/5271; H05B 33/04; H05B 33/28
See application file for complete search history.

(56) References Cited

U.S. PATENT DOCUMENTS 8,319,419 B2 11/2012 Kodama et al.
8,866,130 B2 10/2014 Harai
(Continued)

FOREIGN PATENT DOCUMENTS

JP 2011-023336 A 2/2011
JP 2013-073821 A 4/2013
(Continued)

OTHER PUBLICATIONS

International Search Report for related PCT Published Application No. PCT/JP2016/056674, dated Jun. 7, 2016. English translation provided; 4 pages.

*Primary Examiner* — Dung A. Le
(74) *Attorney, Agent, or Firm* — Procopio, Cory, Hargreaves & Savitch LLP

(57) ABSTRACT

Each of a plurality of the light-emitting units (140) includes a first electrode (110), an organic layer (120), and a second electrode (130). The first electrode (110) is light-transmitting, and the second electrode (130) is light-reflective. The organic layer (120) is located between the first electrode (110) and the second electrode (130). The light-transmitting regions (104 and 106) are located between the plurality of light-emitting units (140). A sealing member (170) covers the plurality of light-emitting units (140) and the light-transmitting regions (104 and 106). The sealing member (170) is fixed directly or through an insulating layer (174) to at least one of a structure (for example, the second electrode 130) formed on a substrate (100), and the substrate (100). In addition, a haze value of the light-emitting device (10) is equal to or less than 2.0%, preferably equal to or less than 1.4%.

2 Claims, 15 Drawing Sheets

(51) Int. Cl.
*H05B 33/04* (2006.01)
*H05B 33/28* (2006.01)

(52) U.S. Cl.
CPC ...... *H01L 51/5268* (2013.01); *H01L 51/5271* (2013.01); *H01L 51/5275* (2013.01); *H05B 33/04* (2013.01); *H05B 33/28* (2013.01); *H01L 51/5225* (2013.01); *H01L 51/5246* (2013.01); *H01L 51/5253* (2013.01); *H01L 2251/5361* (2013.01)

(56) References Cited

U.S. PATENT DOCUMENTS

| | | | |
|---|---|---|---|
| 9,871,227 B2 * | 1/2018 | Inoue | H05B 33/02 |
| 10,497,892 B2 * | 12/2019 | Okada | H05B 33/04 |
| 2010/0078627 A1 | 4/2010 | Yoshinaga | |
| 2010/0314616 A1 | 12/2010 | Kodama et al. | |
| 2012/0293058 A1 * | 11/2012 | Mima | H05B 33/10 |
| | | | 313/46 |
| 2013/0075707 A1 | 3/2013 | Harai | |
| 2015/0333288 A1 | 11/2015 | Sugi et al. | |
| 2016/0343986 A1 | 11/2016 | Inoue et al. | |
| 2017/0117506 A1 | 4/2017 | Hiraoka | |
| 2017/0125737 A1 | 5/2017 | Sakaguchi | |

FOREIGN PATENT DOCUMENTS

| | | |
|---|---|---|
| JP | 2013-131470 A | 7/2013 |
| JP | 2014-154404 A | 8/2014 |
| WO | 2015/115337 A1 | 8/2015 |

* cited by examiner

|  | HAZE VALUE OF SEALING MEMBER (%) | LOCATION OF INTERMEDIATE LAYER | HAZE VALUE OF LIGHT-EMITTING DEVICE (%) | REDUCTION IN LIGHT LEAKAGE TO REAR SURFACE |
|---|---|---|---|---|
| SAMPLE 1 | 0.7 | SIDE OPPOSITE TO SUBSTRATE | 2.0 | GOOD |
| SAMPLE 2 | 0.7 | SIDE OF SUBSTRATE | 1.3 | EXCELLENT |
| COMPARATIVE EXAMPLE | 1.0 | SIDE OF SUBSTRATE | 2.4 | BAD |

LIGHT-EMITTING DEVICE

CROSS-REFERENCE TO RELATED APPLICATIONS

This application is a Continuation of U.S. patent application Ser. No. 16/081,872, filed on Aug. 31, 2018, which is a U.S. National Stage entry of PCT Application No: PCT/JP2016/056674 filed Mar. 3, 2016, the contents of which are incorporated herein by reference.

TECHNICAL FIELD

The present invention relates to a light-emitting device and a light-emitting system.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a transparent material is used for the first electrode, and a metal material is used for the second electrode.

One of the light-emitting devices which utilizes the organic EL is a technology described in Patent Document 1. In order to provide an organic EL element with optical transparency (or a "see-through" property), the second electrode is provided only in a portion of a substrate in the technology in Patent Document 1. In such a structure, since a region located between a plurality of second electrodes transmits light, the organic EL element is capable of having optical transparency. In Patent Document 1, a sealing structure of an organic EL element is a hollow sealing structure.

Further, Patent Document 2 describes sealing the organic EL element by covering the organic EL element with a sealing film and using a sealing plate in an organic EL display device having optical transparency.

RELATED ART DOCUMENT

Patent Document

[Patent Document 1]: Japanese Unexamined Patent Application Publication No. 2014-154404
[Patent Document 2]: Japanese Unexamined Patent Application Publication No. 2011-23336

SUMMARY OF THE INVENTION

In a light-emitting device having optical transparency, there is a case where light emitted by a light-emitting unit is desired to be emitted only from a surface (a surface on a light-emitting side).

An example of the problem to be solved by the present invention is to reduce an amount of light emitted to a rear surface side in a light-emitting device having optical transparency.

Means for Solving the Problem

The invention described in claim 1 is a light-emitting device, including:
a light-transmitting substrate;
a plurality of light-emitting units formed on the substrate, each light-emitting unit including a light-transmitting first electrode, a light-reflective second electrode, and an organic layer located between the first electrode and the second electrode;
a light-transmitting region located between the plurality of light-emitting units; and
a sealing member that covers the plurality of light-emitting units and the light-transmitting region,
wherein the sealing member is fixed to at least one of a structure formed on the substrate and the substrate, directly or through an insulating layer, and
wherein a haze value of the light-emitting device is equal to or less than 2.0%.

The light-emitting device described in claim 9 including:
a light-transmitting substrate;
a plurality of light-emitting units formed on the substrate, each light-emitting unit including a light-transmitting first electrode, a light-reflective second electrode, and an organic layer located between the first electrode and the second electrode;
a light-transmitting region located between the plurality of light-emitting units; and
a sealing member that covers the light-emitting units and the light-transmitting region,
wherein a first surface of the sealing member is fixed through an insulating layer to at least one of a structure formed on the substrate and the substrate,
wherein the first surface of the sealing member has a resin layer that contains inorganic particles, and
wherein a surface roughness of the first surface is higher than that of a second surface which is a surface of the sealing member on the side opposite to the first surface.

The light-emitting system described in claim 10 including:
a light-transmitting partition member that partitions a space from the outside; and
a light-emitting device fixed on the partition member,
the light-emitting device further including:
a light-transmitting substrate;
a plurality of light-emitting units formed on the substrate, each light-emitting unit including a light-transmitting first electrode,
a light-reflective second electrode, and an organic layer located between the first electrode and the second electrode;
a light-transmitting region located between the plurality of light-emitting units; and
a sealing member that covers the plurality of light-emitting units and the light-transmitting region,
wherein the sealing member is fixed to at least one of a structure formed on the substrate and the substrate, directly or through an insulating layer, and
wherein a haze value of the light-emitting device is equal to or less than 2.0%.

BRIEF DESCRIPTION OF THE DRAWINGS

The objects described above, and other objects, features and advantages are further made apparent by a suitable embodiment that will be described below and the following accompanying drawings.

FIG. 3 is an enlarged view of a region of FIG. 2 surrounded by a dotted line a.

FIG. 4 is a table of haze values of a light-emitting device.

DESCRIPTION OF EMBODIMENTS

Figure 1:
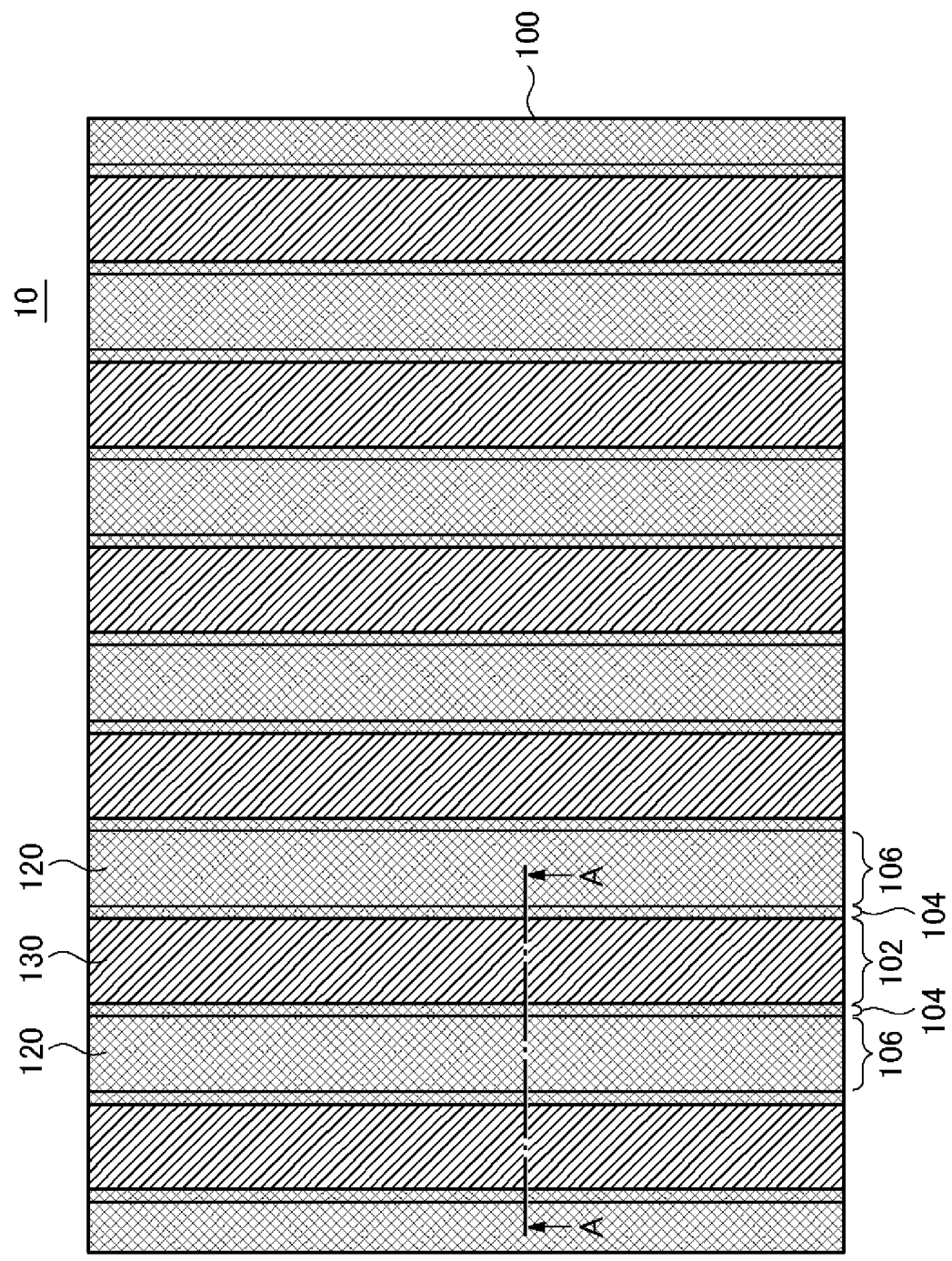
FIG. 1 is a plan view of a configuration of a light-emitting device according to an embodiment.

An embodiment of the present invention will be described below by referring to the drawings. Moreover, in all the drawings, the same constituent elements are given the same reference numerals, and descriptions thereof will not be repeated.

Embodiment

Figure 2:
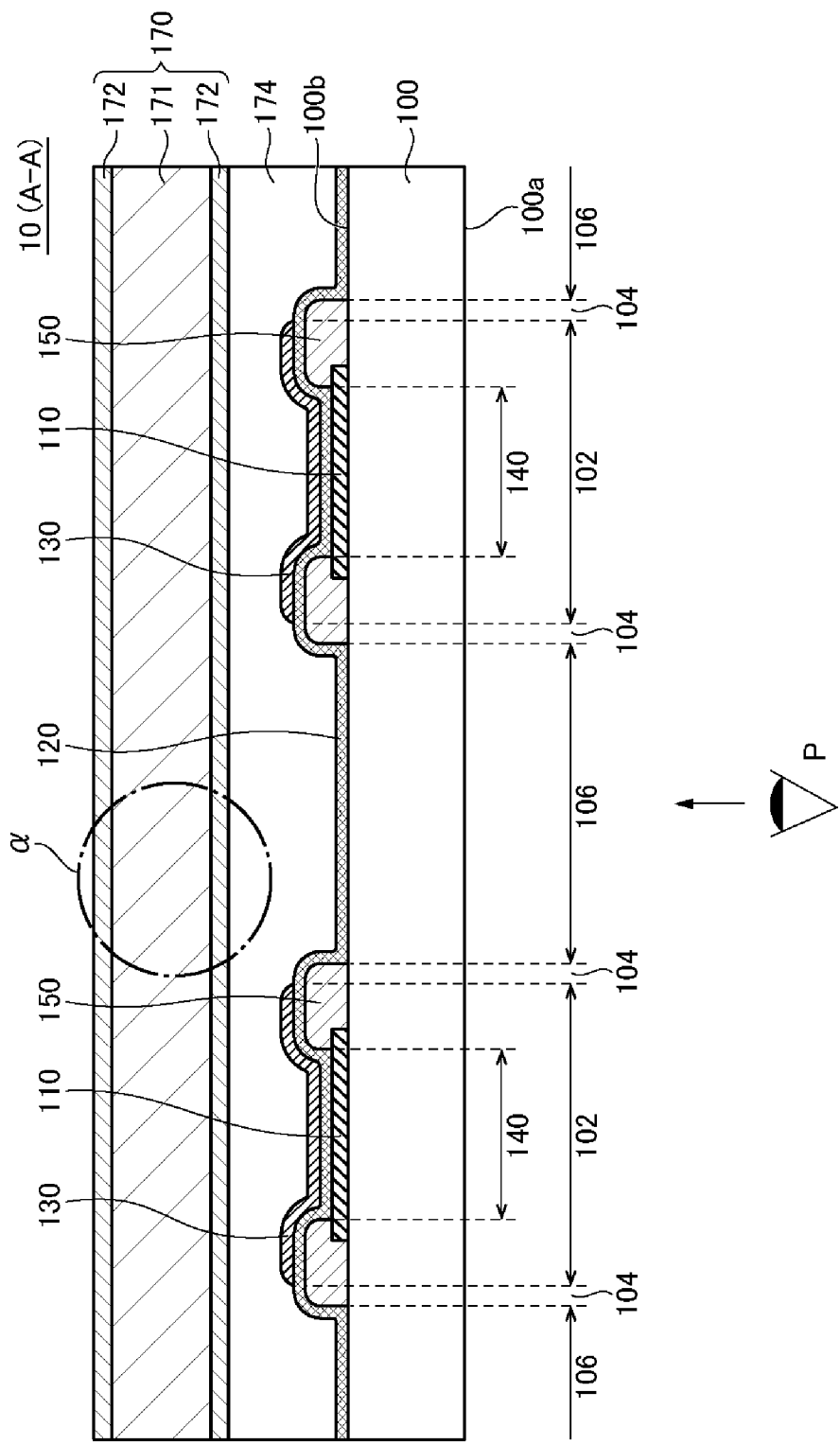
FIG. 2 is a cross-sectional view taken along line A-A of FIG. 1.

FIG. 1 is a plan view of a configuration of a light-emitting device according to an embodiment. FIG. 2 is a cross-sectional view taken along line A-A of FIG. 1. Meanwhile, a sealing member 170 is not shown in FIG. 1 in order that the structure of the light-emitting device 10 may be more easily understood. The light-emitting device 10 according to the embodiment includes a light-transmitting substrate 100, a plurality of light-emitting units 140, a light-transmitting region (a second region 104 and a third region 106), and the sealing member 170. Each of the plurality of light-emitting units 140 includes a first electrode 110, an organic layer 120, and a second electrode 130. The first electrode 110 is light-transmitting, and the second electrode 130 has light reflectivity. The organic layer 120 is located between the first electrode 110 and the second electrode 130. The light-transmitting region (the second region 104 and the third region 106) is located between the plurality of light-emitting units 140. The sealing member 170 covers the plurality of light-emitting units 140 and the light-transmitting region (the second region 104 and the third region 106). The sealing member 170 is fixed to at least one of a structure formed on the substrate 100 (for example, the second electrode 130) and the substrate 100 directly or through an insulating layer 174. In addition, a haze value of the light-emitting device 10 is equal to or less than 2.0%, preferably equal to or less than 1.4%. Meanwhile, the haze value of the light-emitting device 10 and a haze value of a sealing plate 171 of the sealing member 170 are measured by a method conforming to ISO 14782, or a method conforming to JIS K7136. A detailed description will be provided below.

The substrate 100 is, for example, a glass substrate or a resin substrate which has optical transparency. The substrate 100 may have flexibility. In a case where the substrate has flexibility, the thickness of the substrate 100 is, for example, equal to or greater than 10 μm and equal to or less than 1,000 μm. The substrate 100 is polygonal, for example, rectangular, or round. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of $SiN_x$, SiON, or the like is preferably formed on at least one surface (preferably, both surfaces) of the substrate 100 in order to prevent moisture from permeating the substrate 100. The inorganic barrier film is formed by, for example, sputtering, CVD, or ALD. Meanwhile, in a case where the substrate 100 is a resin substrate, methods of forming the light-emitting device 10 include: directly depositing the first electrode 110 and the organic layer 120 on the resin substrate, to be described later, forming the first electrode 110 and layers that follow on a glass substrate, peeling the first electrode 110 from the glass substrate, and thereafter, placing the peeled laminate on a resin substrate.

A light-emitting unit 140 is formed on a second surface 100b of the substrate 100. The light-emitting unit 140 has a configuration in which the first electrode 110, the organic layer 120 including a light-emitting layer, and the second electrode 130 are laminated in this order. In addition, a first surface 100a of the substrate 100 is a surface from which light is emitted.

The first electrode 110 is a transparent electrode which has optical transparency. A material of the transparent electrode is a material containing a metal, for example, a metal oxide such as an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as carbon nanotubes or PEDOT/PSS. In addition, the first electrode 110 may include a laminated structure in which a plurality of films are laminated. In the drawing, a plurality of the first electrodes 110 are linearly formed in parallel to each other on the substrate 100. Therefore, the first electrode 110 is not located in the second region 104 or in the third region 106.

The organic layer 120 is configured by laminating, for example, a hole injection layer, a light-emitting layer, and an electron injection layer in this order. A hole transporting layer may be formed between the hole injection layer and the light-emitting layer. In addition, an electron transporting layer may be formed between the light-emitting layer and the electron injection layer. The organic layer 120 may be formed by vapor deposition. Further, at least one layer of the organic layer 120, for example, a layer in contact with the first electrode 110, may be formed by coating, such as ink jetting, printing, and spraying. Meanwhile, in this case, the remaining layers of the organic layer 120 are formed by vapor deposition. Further, all layers of the organic layer 120 may be formed by coating. Additionally, another light emitting layer (for example, an inorganic light emitting layer) may be provided instead of the organic layer 120. Further, a luminescent color radiated by the light-emitting layer (or a color of light emitted from the organic layer 120) may be different from the luminescent color (or the color of the light emitted from the organic layer 120) of the light-emitting layer of an adjacent light-emitting unit 140.

The second electrode 130 has light reflectivity and includes a metal layer composed of a metal selected from a first group consisting of, for example, Al, Au, Ag, Pt, Mg, Sn, Zn, and In, or an alloy of metals selected from the first group. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition. In the example shown in the drawing, the light-emitting device 10 includes a plurality of linear second electrodes 130. Each second electrode 130 is provided for each first electrode 110, and the width of each second electrode 130 is wider than that of each first electrode 110. Therefore, when viewed from a direction perpendicular to the substrate 100, the entire first electrode 110 is overlapped and covered by the second electrode 130 in the width direction. By adopting this kind of configuration, an extraction direction of the light emitted by the light-emitting layer of the organic layer 120 may be adjusted. Specifically, emission of light to the opposite side to the first surface 100a of the light-emitting device 10 may be inhibited.

The edge of the first electrode 110 is covered by the insulating layer 150. The insulating layer 150 is formed of a photosensitive resin material such as, for example, polyimide, and surrounds a portion of the first electrode 110, the portion serving as the light-emitting unit 140.

When viewed in a direction perpendicular to the substrate 100, the plurality of light-emitting units 140 extend in parallel to one another. In the example shown in FIG. 1, all of the plurality of light-emitting units 140 extend in rectangular shapes (in a striped pattern). However, the light-emitting units 140 may bend in the middle.

When viewed in a direction perpendicular to the substrate 100, the substrate 100 includes the first region 102, the second region 104, and the third region 106. The first region 102 overlaps the second electrode 130. When the second electrode 130 has light reflectivity, the first region 102 does not transmit light either from a front surface to a rear surface or from the rear surface to the front surface of the light-emitting device 10 or the substrate 100. The second region 104 is a region which overlaps the insulating film 150, but does not overlap the second electrode 130. The third region 106 neither overlaps the second electrode 130 nor the insulating film 150. In addition, since the width of the second region 104 is narrower than that of the third region 106, the light-emitting device 10 has sufficient optical transparency.

In the example shown in the drawing, the organic layer 120 is also formed in the second region 104 and the third region 106. In other words, the organic layer 120 of the plurality of light-emitting units 140 is formed continuously. However, the organic layer 120 is not required to be formed in the third region 106. In addition, the organic layer 120 is not required to be formed in the second region 104.

The width of the second region 104 is narrower than that of the third region 106. In addition, the width of the third region 106 may be wider or narrower than that of the first region 102. In a case where the width of the first region 102 is 1, the width of the second region 104 is, for example, equal to or greater than 0 (or more than 0 or equal to or greater than 0.1) and equal to or less than 0.2, and the width of the third region 106 is, for example, equal to or greater than 0.3 and equal to or less than 2. Further, the width of the first region 102 is, for example, equal to or greater than 50 μm and equal to or less than 500 μm, the width of the second region 104 is, for example, equal to or greater than 0 μm (or more than 0 μm) and equal to or less than 100 μm, and the width of the third region 106 is, for example, equal to or greater than 15 μm and equal to or less than 1,000 μm.

The light-emitting device 10 includes the sealing member 170. The sealing member 170 includes the sealing plate 171 and the barrier film 172. The sealing plate 171 is a plate-like member composed of, for example, resin. The resin composing the sealing plate 171 is, for example, polyethylene naphthalate (PEN), polyether sulphone (PES), polyethylene terephthalate (PET), or polyimide. The barrier film 172 is, for example, an inorganic film formed on at least one surface (preferably both surfaces) of the sealing plate 171. The barrier film 172 is, for example, $SiN_x$ or SiON, and formed by, for example, sputtering, CVD, or ALD. The sealing member 170 is fixed to the second surface 100b of the substrate 100 and a structure on the substrate 100 (for example, the second electrode 130), by using, for example, an insulating layer 174 (for example, an adhesive layer or a pressure-sensitive adhesive layer). Meanwhile, at least a portion of the insulating layer 174 may be in contact with the second electrode 130.

Figures 3, 4:
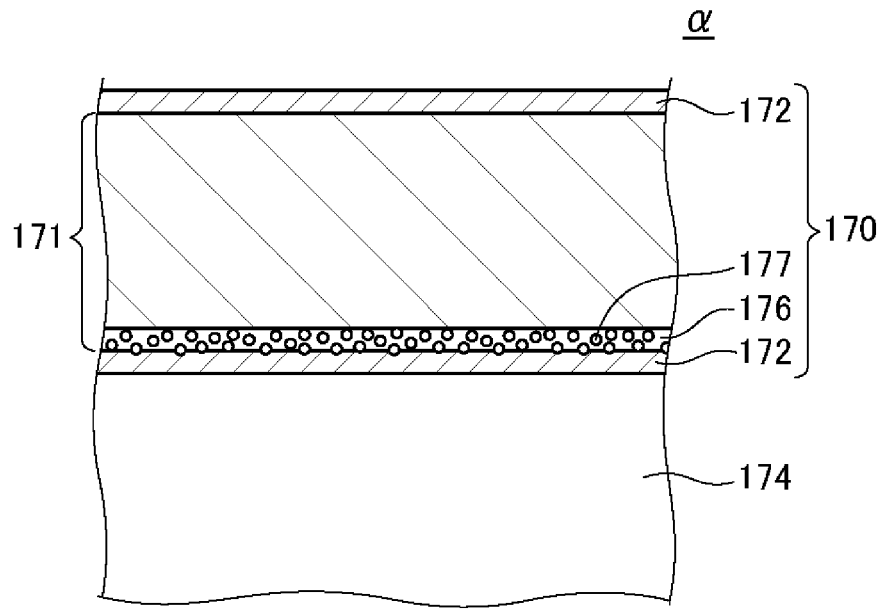

FIG. 3 is an enlarged view of a region illustrated in FIG. 2 surrounded by a dotted line a. As shown in the drawing, the surface roughness of a surface of the sealing plate 171 on the insulating layer 174 side is higher than that of a surface on the side opposite to the surface. In other words, the surface of the sealing plate 171 having a relatively high surface roughness is set to face the insulating layer 174.

In the example shown in FIG. 3, the sealing plate 171 has an intermediate layer 176 on one surface thereof. The intermediate layer 176 is formed using, for example, an insulating material, and contains particles 177. The particles 177 are formed using, for example, an insulating material. The insulating material which configures the particles 177 is also called a lubricating material and is an inorganic material such as, for example, $SiO_2$ or resin. The thickness of the intermediate layer 176 is, for example, equal to or greater than 100 nm and equal to or less than 3,000 nm. The intermediate layer 176 is provided so that a protective sheet is easily peeled off or wound in a roll-shape from the sealing plate 171. A surface of the intermediate layer 176 includes irregularities resulting from the particles 177. A height of the irregularities is, for example, equal to or less than 100 nm. Therefore, the surface roughness of a surface (a first surface) of the sealing plate 171 having the intermediate layer 176 thereon is higher than that of a surface (a second surface) of the sealing plate 171 on the side opposite thereto.

Meanwhile, a smooth layer may be provided on a surface of the sealing plate 171 on the side opposite to the insulating layer 174. In this case, even when the sealing plate 171 does not include the intermediate layer 176, the surface roughness of the surface of the sealing plate 171 on the side of the insulating layer 174 is higher than that of a surface on the side opposite thereto. At this time, in order to increase the surface roughness of the surface of the sealing plate 171 on the side of the insulating layer 174 compared to the other side, particles may be mixed into the resin which configures a main portion of the sealing plate 171.

Meanwhile, a haze value of the sealing member 170 is, for example, less than 1.0, for example, equal to or less than 0.8.

Next, a method of manufacturing the light-emitting device 10 will be described. First, the first electrode 110 is formed on the second surface 100b of the substrate 100. Next, the insulating film 150 is formed, and additionally, the organic layer 120 and the second electrode 130 are formed. Thereby, the light-emitting unit 140 is formed.

In addition, the sealing plate 171 is prepared. At this time, the intermediate layer 176 is formed on one surface of the sealing plate 171. Next, the barrier film 172 is formed on the sealing plate 171. When the barrier film 172 is formed on the surface of the sealing plate 171 having the intermediate layer 176 thereon, the barrier film 172 is located over the intermediate layer 176.

Next, the sealing member 170 is fixed to a surface of the substrate 100 on which the light-emitting unit 140 is formed using the insulating layer 174. At this time, a surface of the sealing member 170 having the intermediate layer 176 thereon preferably faces the substrate 100 side. Thereby, the light-emitting device 10 is formed.

FIG. 4 is a table of haze values of the light-emitting device 10. In sample 1 and sample 2 according to the embodiment, the haze value of the sealing plate 171 of the sealing member 170 is 0.7. In addition, in sample 1, a surface of the sealing plate 171 having the intermediate layer 176 thereon faces the side opposite to the substrate 100, and in sample 2, the surface of the sealing plate 171 having the intermediate layer 176 thereon faces the substrate 100. In addition, in the light-emitting device 10 according to a comparative example, a haze value of the sealing plate 171 is 1.0.

In sample 1, a haze value of the light-emitting device 10 was 2.0. In addition, the amount of light which leaked to the side opposite to the substrate 100 (a rear surface side) of the light-emitting device 10 was small and hardly noticeable even if it was visually recognizable.

In sample 2, the haze value of the light-emitting device 10 was 1.3. In addition, the amount of light which leaked to the rear surface side of the light-emitting device 10 was even lower. Meanwhile, the reason why the haze value of the light-emitting device 10 in sample 2 was lower than that of the light-emitting device 10 in sample 1 may be considered as follows. As described above, since the surface of the intermediate layer 176 includes irregularities, when reflection of light occurs on the surface of the intermediate layer 176, the advancing direction of the light (an angle with respect to the substrate 100) is changed. Due to this change, a portion of light which was less than a critical angle of a certain interface becomes larger than the critical angle on the interface, and as a result, the amount of light which leaks to the rear surface side of the light-emitting device 10 increases. Thereby, in order to reduce the amount of the light which leaks to the rear surface side of the light-emitting device 10, it is necessary to inhibit the reflection of light on the surface of the intermediate layer 176. In contrast, in sample 2, the intermediate layer 176 is in contact with the insulating layer 174. Since the refractive index of the insulating layer 174 is larger than 1, the difference between the refractive index of the insulating layer 174 and that of the intermediate layer 176 is lower than the difference between the refractive index of the intermediate layer 176 and that of air. Thereby, in sample 2, the reflection of light on the surface of the intermediate layer 176 is inhibited compared to sample 1.

On the other hand, the haze value of the light-emitting device 10 in the comparative example was 2.4. The amount of light which leaked to the side opposite to the substrate 100 of the light-emitting device 10 was an amount which was recognizable to a person. According to FIG. 4, when the haze value of the light-emitting device 10 is equal to or less than 2.0, it is possible to sufficiently reduce the amount of light which leaks to the rear surface side of the light-emitting device 10.

Modification Example 1

Figure 5:
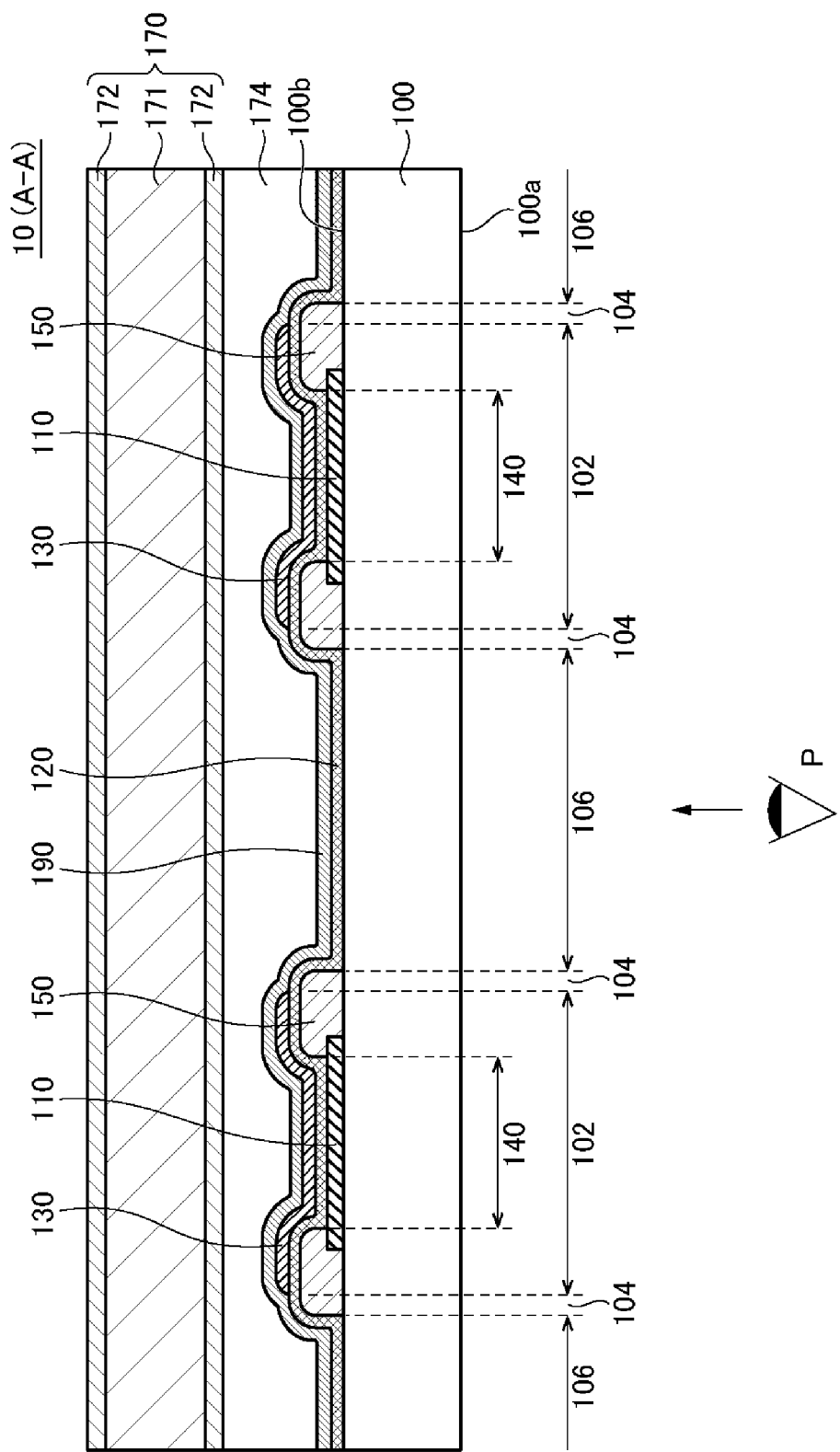
FIG. 5 is a cross-sectional view of a configuration of a light-emitting device according to Modification Example 1.

FIG. 5 is a cross-sectional view of a configuration of a light-emitting device 10 according to Modification Example 1, and corresponds to FIG. 2 of the embodiment. The light-emitting device 10 according to the present modification example has the same configuration as that of the light-emitting device 10 according to the embodiment, except that an inorganic film 190 is included.

The inorganic film 190 covers the light-emitting units 140, and functions as a sealing film. In detail, the inorganic film 190 is formed on a surface of the substrate 100 on which at least the light-emitting units 140 are formed, and covers the light-emitting units 140. In addition, an insulating layer 174 is in contact with the inorganic film 190. In other words, the inorganic film 190 is located between the light-emitting units 140 and the insulating layer 174.

The inorganic film 190 is formed of an inorganic material, for example, an aluminum oxide or a titanium oxide. In addition, the thickness of the inorganic film 190 is preferably equal to or less than 300 nm. Moreover, the thickness of the inorganic film 190 is, for example, equal to or greater than 50 nm. The inorganic film 190 is formed after forming a second electrode 130, and before mounting the sealing member 170 over the substrate 100.

The inorganic film 190 is formed by, for example, ALD (Atomic Layer Deposition). The inorganic film 190 may have a multilayer structure in which multiple layers are laminated. In this case, the inorganic film 190 may be configured by repeatedly laminating a first sealing layer composed of a first material (for example, an aluminum oxide) and a second sealing layer composed of a second material (for example, a titanium oxide). The lowermost layer may be any of the first sealing layer and the second sealing layer. In addition, the uppermost layer may be any of the first sealing layer and the second sealing layer. In addition, the inorganic film 190 may be a single layer in which the first material and the second material are mixed.

However, the inorganic film 190 may be formed using another film formation method, for example, CVD or sputtering. In this case, the inorganic film 190 is formed of $SiO_2$, SiN, or the like, and the thickness thereof is, for example, equal to or greater than 10 nm and equal to or less than 1,000 nm.

Also in the present modification example, the same as the embodiment, when the haze value of the light-emitting device 10 is equal to or less than 2.0, it is possible to sufficiently reduce the amount of light which leaks to the rear surface side of the light-emitting device 10.

Modification Example 2

Figure 6:
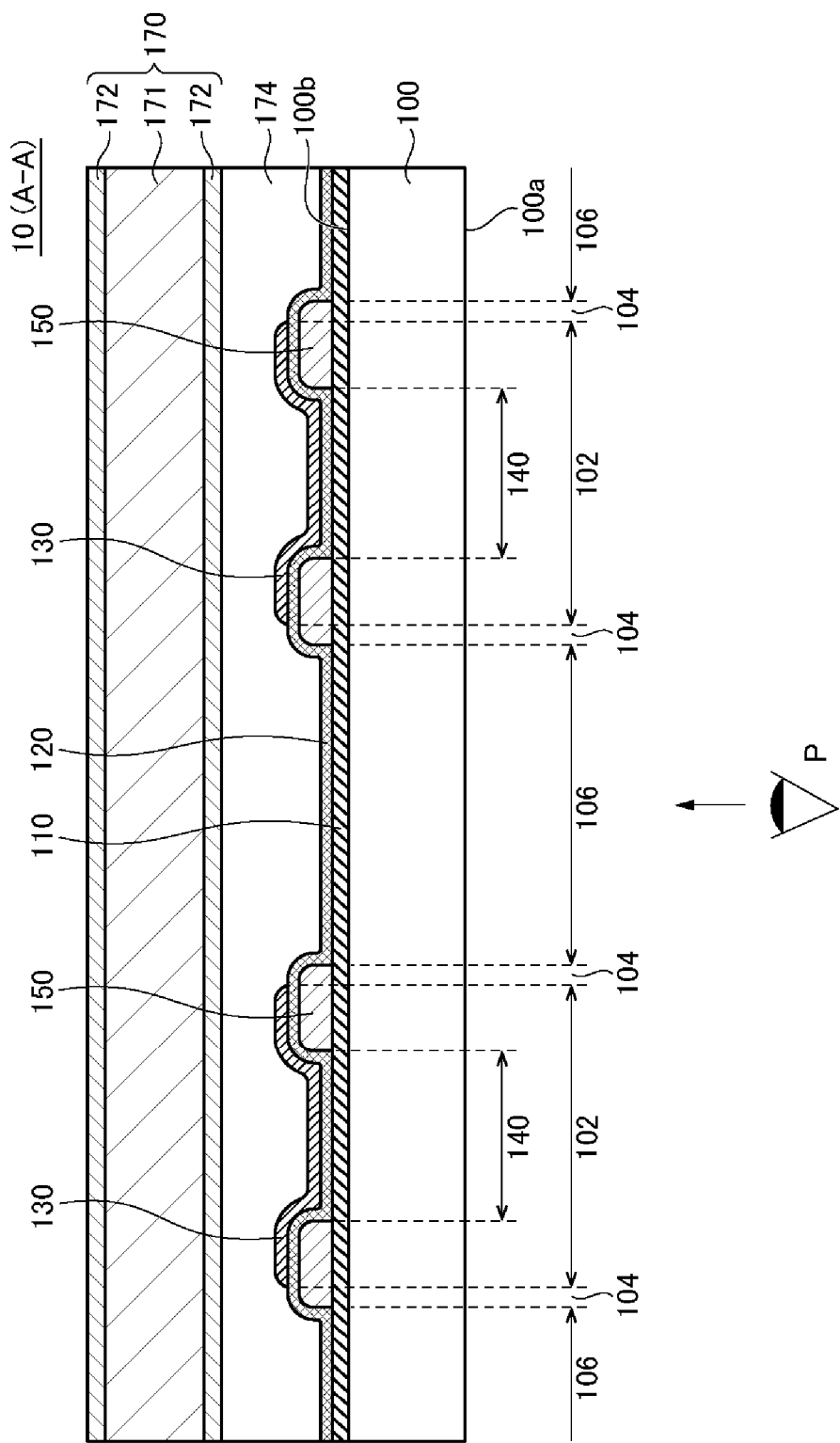
FIG. 6 is a cross-sectional view of a configuration of a light-emitting device according to Modification Example 2.

FIG. 6 is a cross-sectional view of a configuration of a light-emitting device 10 according to Modification Example 2, and corresponds to FIG. 2 of the embodiment. The light-emitting device 10 according to the present modification example has the same configuration as that of the light-emitting device 10 according to the embodiment, except that the first electrode 110 is formed in all of the first region 102, the second region 104 and the third region 106. In other words, each of the first electrodes 110 of the plurality of light-emitting units 140 is connected to another.

In the present modification example also, the same as the embodiment, the possibility of light leakage to the rear surface side of the light-emitting device 10 can be reduced. Meanwhile, in the light-emitting device 10 according to Modification Example 1, the first electrode 110 may have the same configuration as that of the present modification example.

Modification Example 3

Figure 7:
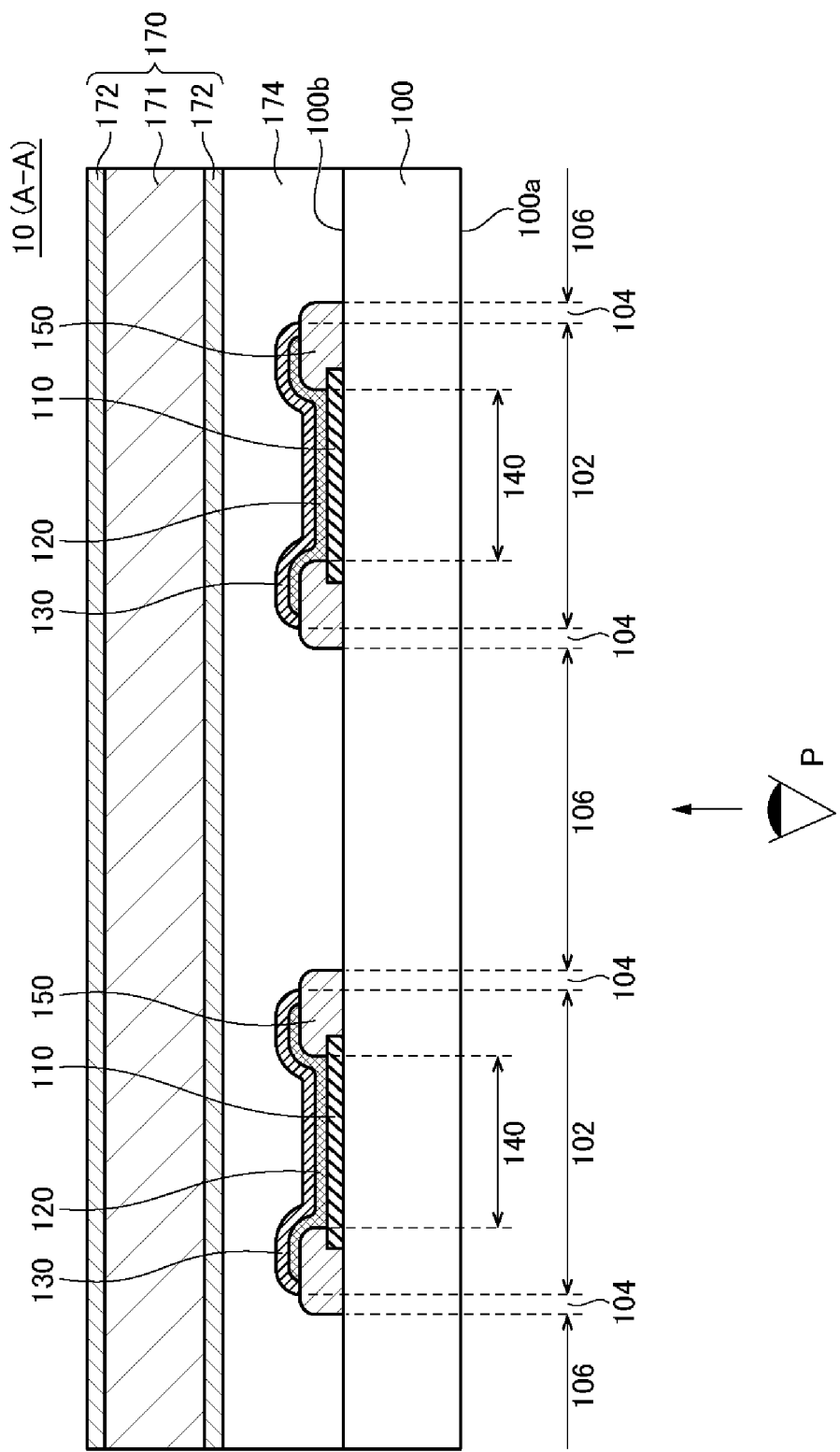
FIG. 7 is a cross-sectional view of a configuration of a light-emitting device according to Modification Example 3.

FIG. 7 is a cross-sectional view of a configuration of a light-emitting device 10 according to Modification Example 3, and corresponds to FIG. 2 of the embodiment. The light-emitting device 10 according to the present modification example has the same configuration as that of the light-emitting device 10 according to the embodiment, except that the organic layer 120 is divided between the light-emitting units 140 next to each other. The organic layer 120 is not formed in, for example, a portion of, or the entire portion of the third region 106. The organic layer 120 is not required to be formed in the second region 104 on the side of the third region 106. However, the organic layer 120 may be formed in the second region 104 and the third region 106 on the second region 104 side.

In the present modification example also, the same as the embodiment, the possibility of light leakage to the rear surface side of the light-emitting device 10 can be reduced. Meanwhile, in the light-emitting device 10 according to Modification Example 1 or Modification Example 2, the organic layer 120 may have the same configuration as that of the present modification example.

Modification Example 4

Figure 8:
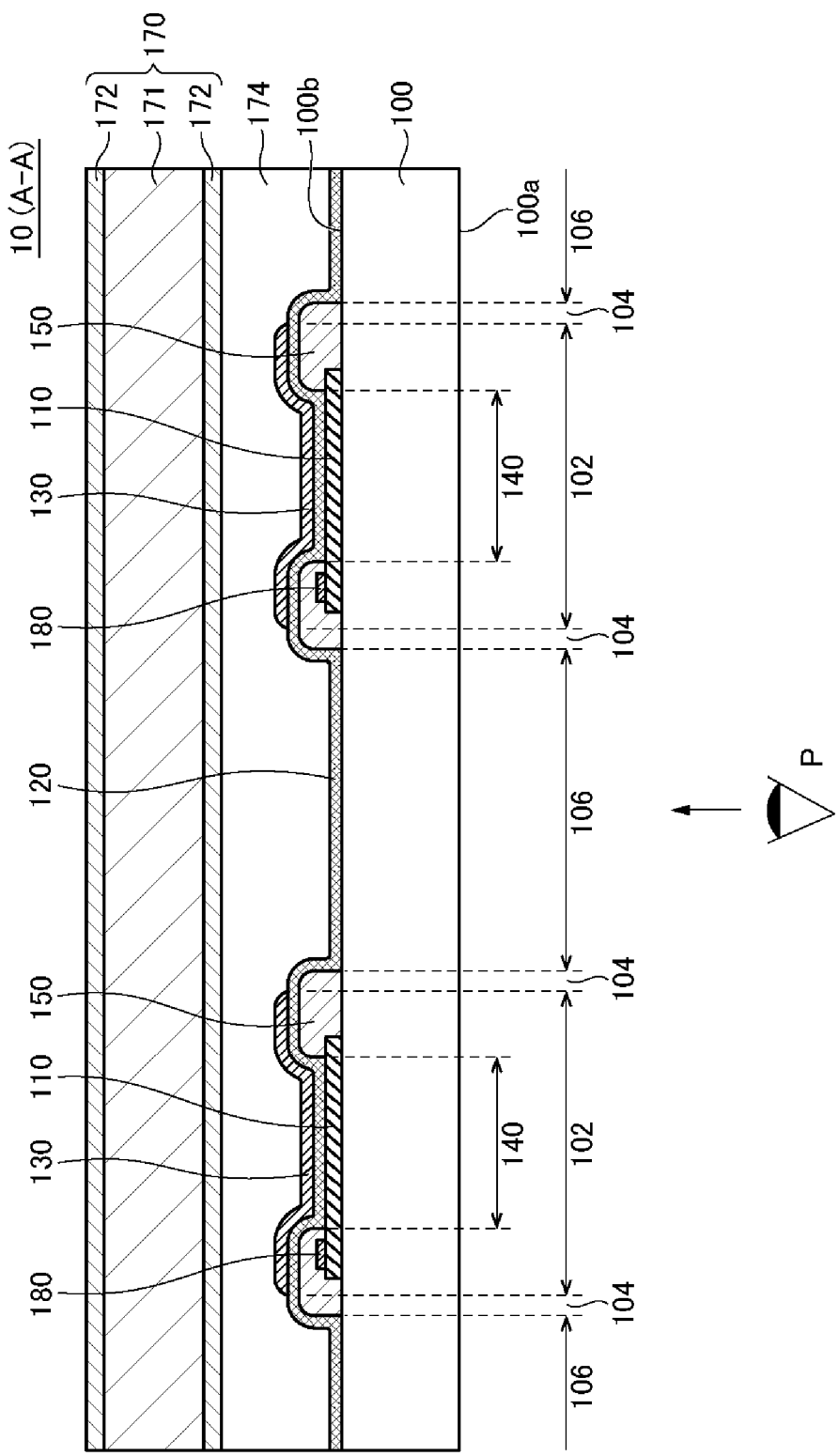
FIG. 8 is a cross-sectional view of a configuration of a light-emitting device according to Modification Example 4.

FIG. 8 is a cross-sectional view of a configuration of a light-emitting device 10 according to Modification Example 4, and corresponds to FIG. 2 of the embodiment. The light-emitting device 10 according to the present modification example has the same configuration as that of the light-emitting device 10 according to the embodiment, except that the first electrode 110 includes a conductive layer 180. The conductive layer 180 is an auxiliary electrode of the first electrode 110, and has a configuration in which, for example, a Mo alloy layer, an Al alloy layer, and a Mo alloy layer are laminated in this order. The conductive layer 180 may also be formed using an Ag alloy. The conductive layer 180 is formed on a portion of the first electrode 110 covered by the insulating film 150. However, the conductive layer 180 may be formed between the first electrode 110 and the substrate 100 (or between the first electrode 110 and an optical function layer 160).

In the present modification example also, the same as the embodiment, a possibility of light leakage to a rear surface side of the light-emitting device 10 can be reduced. Meanwhile, the light-emitting device 10 according to any of Modification Examples 1-3 may be provided with the conductive layer 180.

Modification Example 5

Figure 9:
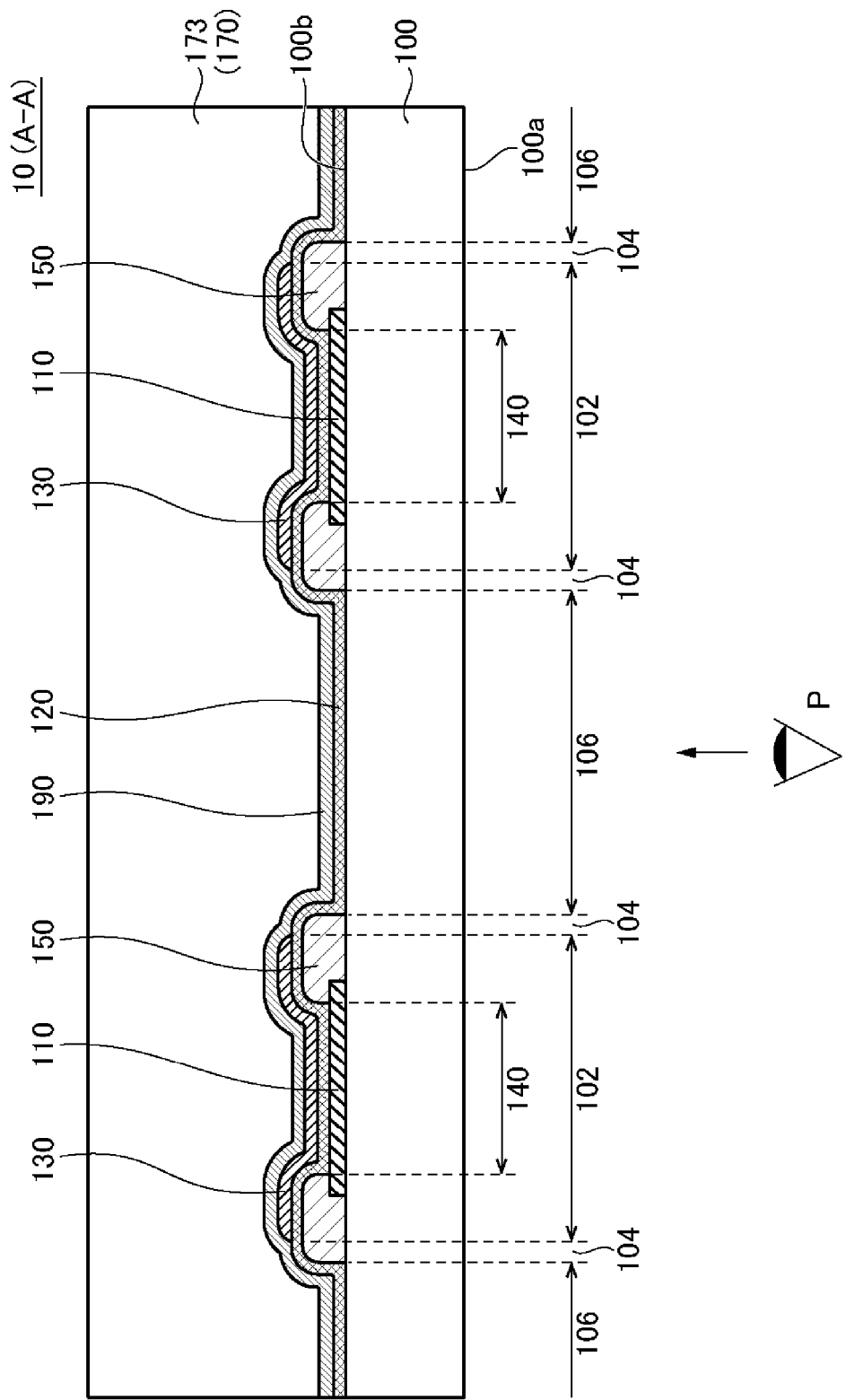
FIG. 9 is a cross-sectional view of a configuration of a light-emitting device according to Modification Example 5.

FIG. 9 is a cross-sectional view of a configuration of a light-emitting device 10 according to Modification Example 5, and corresponds to FIG. 2 of the embodiment. The light-emitting device 10 according to the present embodiment has the same configuration as that of the light-emitting device 10 according to Modification Example 1, except that an inorganic film 190 and a resin layer 173 are included. The resin layer 173 is, for example, a photo-curing acrylic resin, and formed using a dispenser or a coating method such as slit coating, spin coating, or the like.

In the present modification example also, the same as the embodiment, a possibility of light leakage to a rear surface side of the light-emitting device 10 can be reduced.

Example 1

Figure 10:
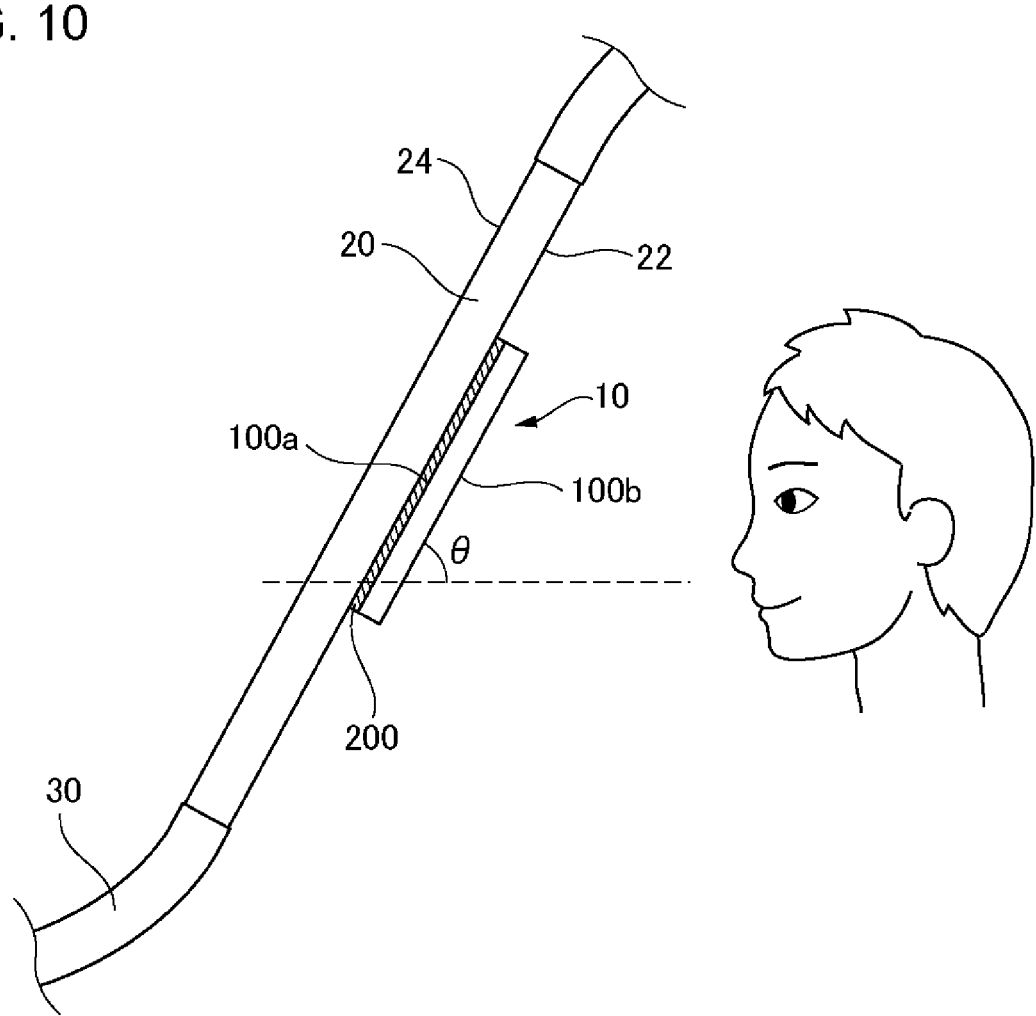
FIG. 10 is a cross-sectional view of a configuration of a light-emitting system according to Example 1.

FIG. 10 is a cross-sectional view of a configuration of a light-emitting system according to Example 1. The light-emitting system includes a light-emitting device 10 and a partition member 20. The partition member 20 is light-transmitting, and partitions a space from the exterior. This space is, for example, a space occupied by a person, or a space having an object such as a commercial product disposed therein. The light-emitting device 10 has the same configuration as the embodiment or any of the modification examples. In the example shown in the drawing, a surface of the substrate 100 on the side provided with the light-emitting unit 140 (a second surface 100b) is directed toward the space occupied by a person.

The partition member 20 is, for example, a window of a mobile object 30 for transporting a person, or a window of a showcase, and is formed using glass or a light-transmitting resin. The mobile object 30 is, for example, an automobile, a train, or an airplane. In a case where the mobile object 30 is an automobile, the partition member 20 is a windshield, a rear windshield, or a side window (for example, a door window) installed at the side of the seat. In a case where the partition member 20 is a rear windshield, a plurality of light-emitting units 140 function as, for example, a brake light. In addition, in a case where the partition member 20 is a windshield or a rear windshield, the plurality of light-emitting units 140 may be a turn signal light. Moreover, the partition member 20 may be a window for partitioning the interior and the exterior of a room such as a meeting room. The light-emitting system may allow to distinguish whether the meeting room is occupied, depending on the lighting/non-lighting of the light-emitting unit 140. The partition member 20 may be inclined by an angle θ (for example, larger than 45 degrees and smaller than 90 degrees) with respect to a horizontal plane or may be vertical (θ is 90 degrees) with respect to the horizontal plane.

Further, a first surface 100a of the light-emitting device 10, that is, a surface on the light extraction side, is fixed to the inner surface (a first surface 22) of the partition member 20 with an adhesive layer 200 interposed therebetween. Therefore, light emitted from the light-emitting units 140 of the light-emitting device 10 is emitted to the exterior of the above-mentioned space (for example, the mobile object 30) through the partition member 20. Further, the light-emitting device 10 has optical transparency. Therefore, a person can view the exterior and the interior of the space through the partition member 20. For example, a person inside the mobile object 30 can visually recognize the outside of the mobile object 30 through the partition member 20. Meanwhile, the first surface 100a of the substrate 100 may be entirely fixed to the first surface 22 of the partition member 20 via the adhesive layer 200, or a portion (for example, two sides facing each other) of the first surface 100a may be fixed to the first surface 22 of the partition member 20.

The adhesive layer 200 fixes the light-emitting device 10 to the partition member 20. As long as a material fulfilling such a function is used, there is no particular limitation to the material of the adhesive layer 200. In addition, in a case where a refractive index of the partition member 20 and that of the substrate 100 of the light-emitting device 10 are substantially the same, such as, for example, a case where both the partition member 20 and the substrate 100 are formed of glass, a material having a refractive index the same as or close to those of the both is used as the adhesive layer 200. In addition, in a case where the partition member 20 and the substrate 100 are different from each other in refractive indexes (for example, the partition member 20 is formed of plastic, and the substrate 100 is formed of glass), the refractive index of the adhesive layer 200 is preferably a numerical value between the refractive index of the partition member 20 and the refractive index of the substrate 100. With such a configuration, light emitted from the organic layer 120 can be efficiently extracted to the outside through the partition member 20. In addition, the light-emitting device 10 and the partition member 20 are preferably bonded to each other without any gaps therebetween, since if there is a gap, light emitted from the light-emitting device 10 is reflected by the partition member 20, and the reflected light is transmitted to the inside through the second region 104 and the third region 106.

The light-emitting device 10 has a configuration shown in any of the embodiment and each modification example. Therefore, a possibility of light leakage to a rear surface side (the right side in FIG. 10) of the light-emitting device 10 can be reduced.

Example 2

Figure 11:
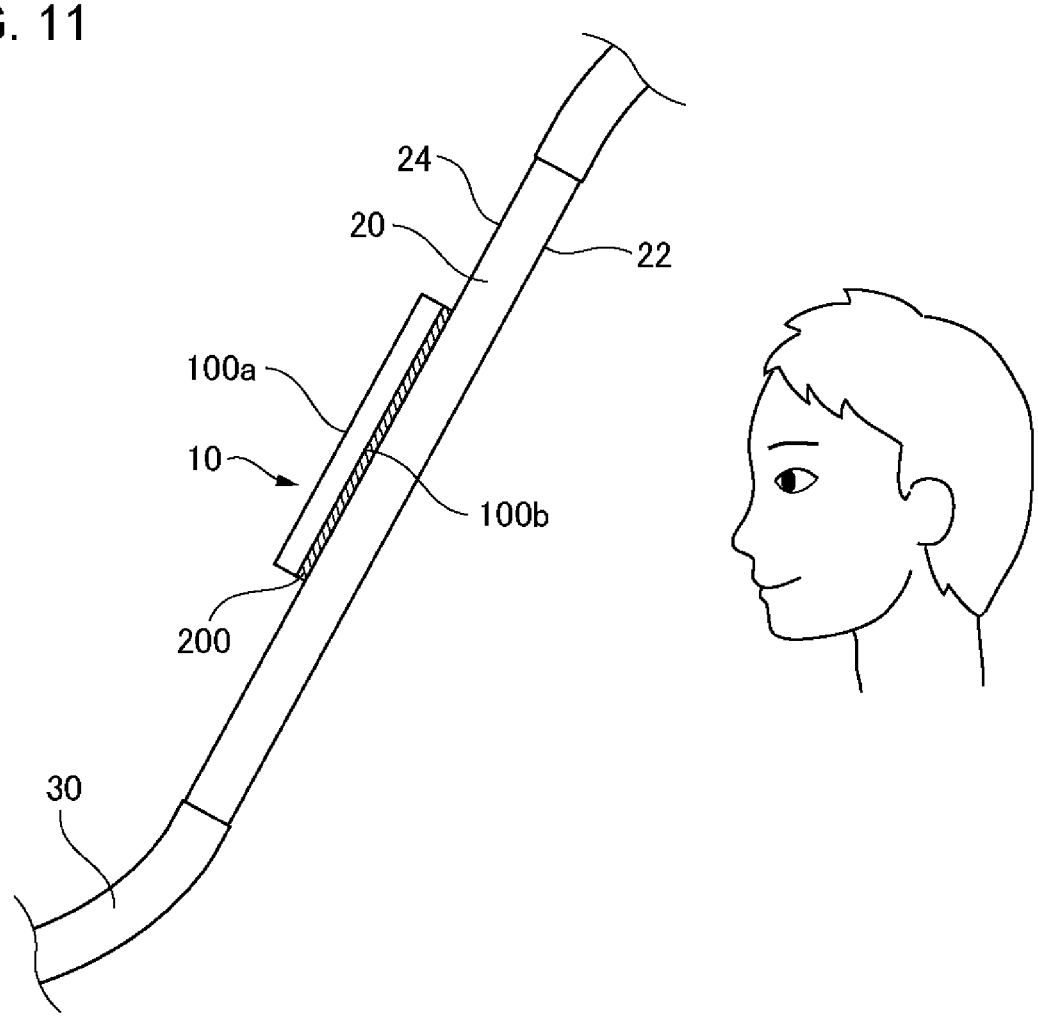
FIG. 11 is a cross-sectional view of a configuration of a light-emitting system according to Example 2.

FIG. 11 is a cross-sectional view of a configuration of a light-emitting system according to Example 2. The light-emitting system according to the present example has the same configuration as that of the light-emitting system according to Example 1, except that the light-emitting device 10 is mounted on the partition member 20 on an outer surface (a second surface 24) of the mobile object 30.

The light-emitting device 10 according to the present example has the same configuration as that of the embodiment and any of each modification example. However, in this light-emitting device 10, the surface thereof on the opposite side of the partition member 20 serves as the light extraction surface. In order to achieve such configuration, the second surface 100b of the light-emitting device 10 may be made to face the partition member 20.

In the present modification example also, the same as the embodiment, a possibility of light leakage to a rear surface side of the light-emitting device 10 can be reduced.

In addition, light emitted from the light-emitting device 10 is emitted directly to the exterior of the mobile object 30 without passing through the partition member 20. Therefore, compared to the embodiment, a person who is outside the mobile object 30 can easily recognize the light from the light-emitting device 10. In addition, since the light-emitting device 10 is mounted on the outside of the mobile object 30, that is, the light-emitting device 10 is mounted on the second surface 24 side of the partition member 20, it is possible to prevent light emitted from the light-emitting device 10 from being reflected by the partition member 20 and entering the interior of the mobile object 30.

Example 3

Figure 12:
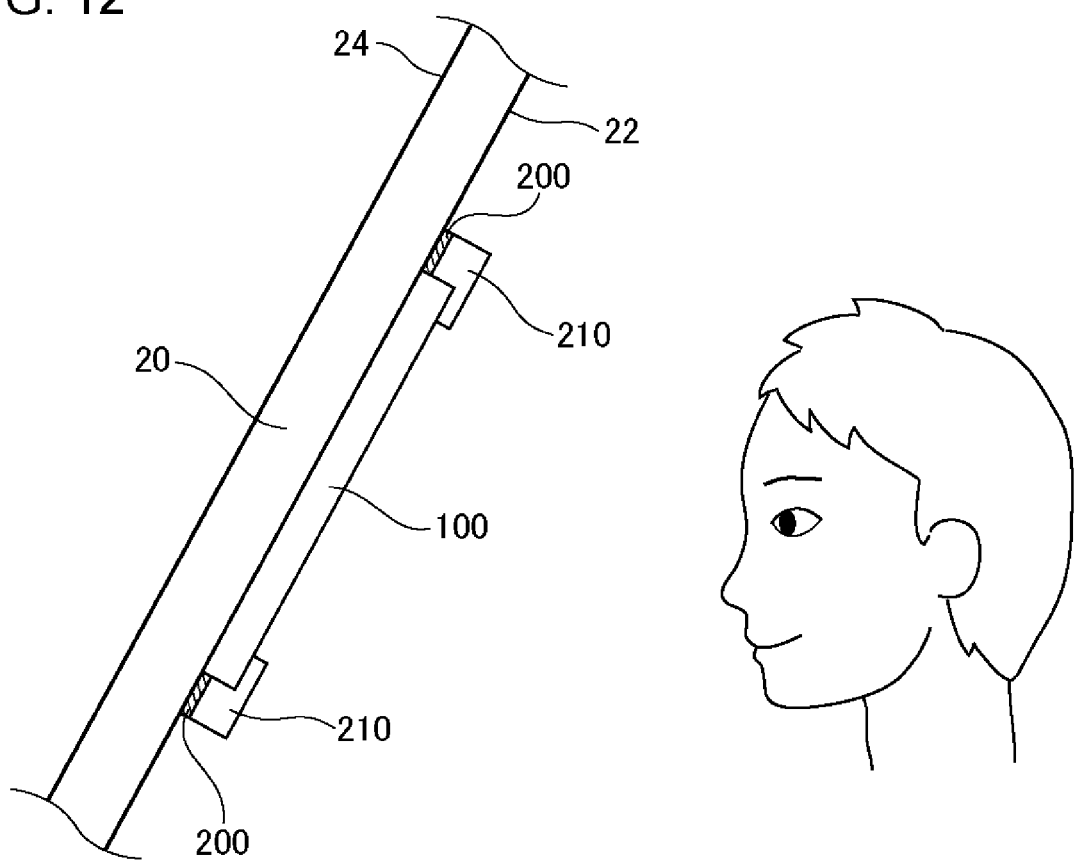
FIG. 12 is a cross-sectional view of a configuration of a light-emitting system according to Example 3.

FIG. 12 is a cross-sectional view of a configuration of the light-emitting system according to Example 3. The light-emitting system according to the present example has the same configuration as that of the light-emitting system according to Example 1, except that the light-emitting device 10 is fixed to the partition member 20 using the fixing member 210.

The fixing member 210 is a frame-shaped member, and a lower surface thereof is fixed to the partition member 20 using an adhesive layer 200. An upper portion of the fixing member 210 is bent toward the inner side thereof, and this bent portion holds the edge of the light-emitting device 10. However, the shape of the fixing member 210 is not limited to the example shown in the drawing.

In the present modification example also, the same as the embodiment, a possibility of light leakage to a rear surface side of the light-emitting device 10 can be reduced.

Figure 13:
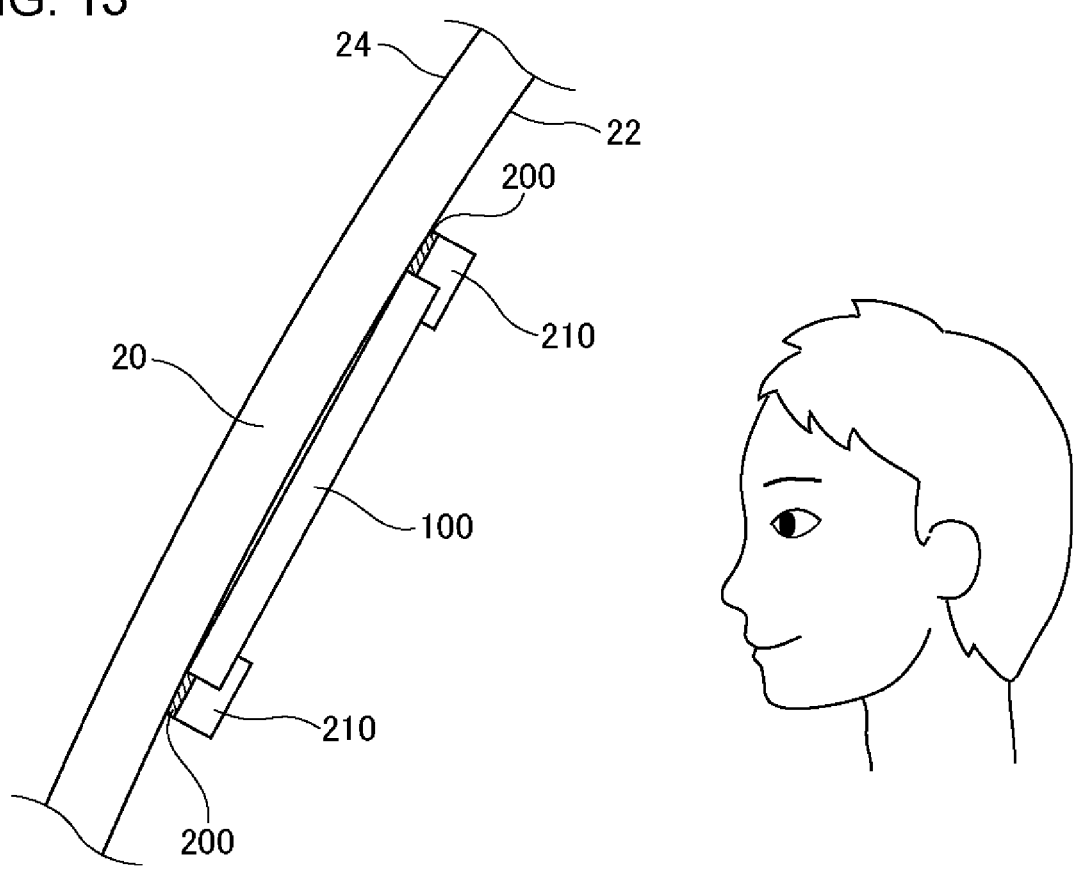
FIG. 13 is a cross-sectional view of a modification example of FIG. 12.

In addition, as illustrated in FIG. 13, there is a case where the partition member 20 is curved in a direction projecting to the outside of the mobile object 30. In such a case, it is difficult to directly fix the flat plate-like light-emitting device 10 on the inner surface (a first surface 22) of the partition member 20. However, use of the fixing member 210 allows the light-emitting device 10 to be fixed to the first surface 22 of the partition member 20 even in such circumstances.

In a case where a curved partition member 20 and the flat plate-like light-emitting device 10 are fixed by the above method, a filler may be filled in a gap between the partition member 20 and the light-emitting device 10. As mentioned above, if there is a gap, light emitted from the light-emitting device 10 is reflected on the partition member 20, and the reflected light is transmitted to the interior of the light-emitting device 10 via the second region 104 and the third region 106. In a case where refractive indexes of the partition member 20 and the substrate 100 of the light-emitting device 10 are substantially the same as each other (for example, in a case where both are formed by glass), the refractive index of the filler is preferably the same as, or a close value to the refractive indexes of the partition member 20 and the substrate 100. In addition, in a case where the refractive indexes of the partition member 20 and the substrate 100 are different from each other (for example, when the partition member 20 is formed of plastic and the substrate 100 is formed of glass), the refractive index of the filler is preferably a value between the refractive indexes of the partition member 20 and the substrate 100 of the light-emitting device 10.

Example 4

Figure 14:
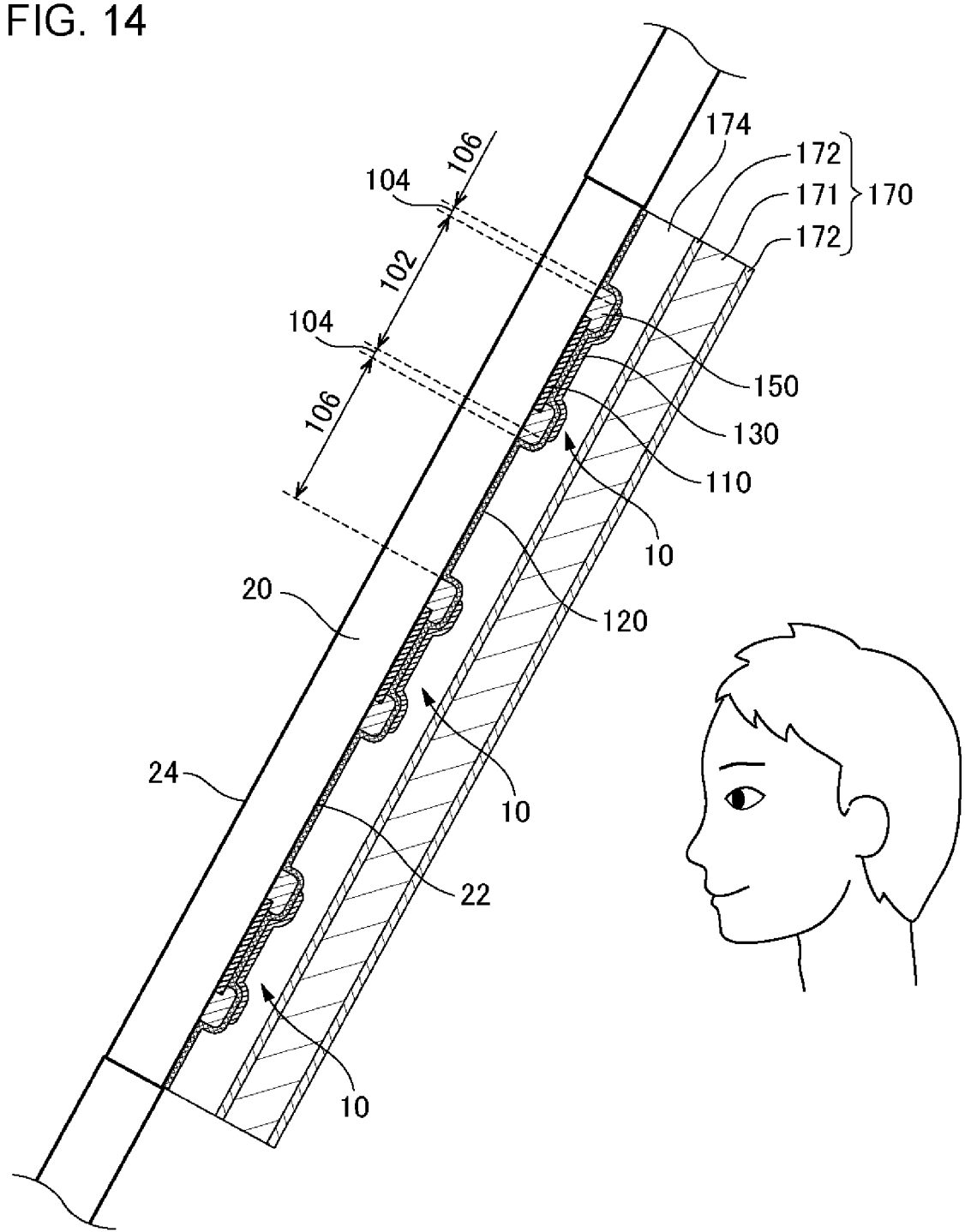
FIG. 14 is a cross-sectional view of a configuration of a light-emitting system according to Example 4.

FIG. 14 is a cross-sectional view of a configuration of the light-emitting system according to Example 4. The light-emitting system according to the present example has the same configuration as that of the light-emitting system according to Example 1, except that the light-emitting units 140, the insulating layer 174, and the sealing member 170 are formed over the first surface 22 or the second surface 24 of the partition member 20. In other words, in the present example, the partition member 20 also serves as the substrate 100 according to Example 1.

Meanwhile, in the present example, a concave portion may be formed in the partition member 20 on a surface on which the light-emitting units 140 are formed, and the light-emitting units 140 may be formed in the concave portion. For example, one concave portion may be formed in a region in which a plurality of the light-emitting units 140 are formed, and the plurality of light-emitting units 140 may be formed on the bottom surface of the one concave portion; or individual concave portions may be formed for each of the plurality of light-emitting units 140. In this case, sealing of the light-emitting unit 140 may be configured to seal the plurality of concave portions at once by a highly optically transparent configuration, for example, by film sealing. In either case of forming individual concave portions for each light-emitting unit 140 and forming one concave portion for a plurality of light-emitting units 140, the light-emitting unit 140 is inhibited from projecting from the partition member 20. Meanwhile, in a case where the light-emitting units 140 are formed in the concave portion of the partition member 20, upper parts of the light-emitting units 140 may be projected from the first surface 22 (or the second surface 24) of the partition member 20, or the light-emitting units 140 may be located entirely below the first surface 22 (or the second surface 24).

In the present modification example also, the same as Example 1, a possibility of light leakage to a rear surface side of the light-emitting device 10 can be reduced.

Example 5

Figure 15:
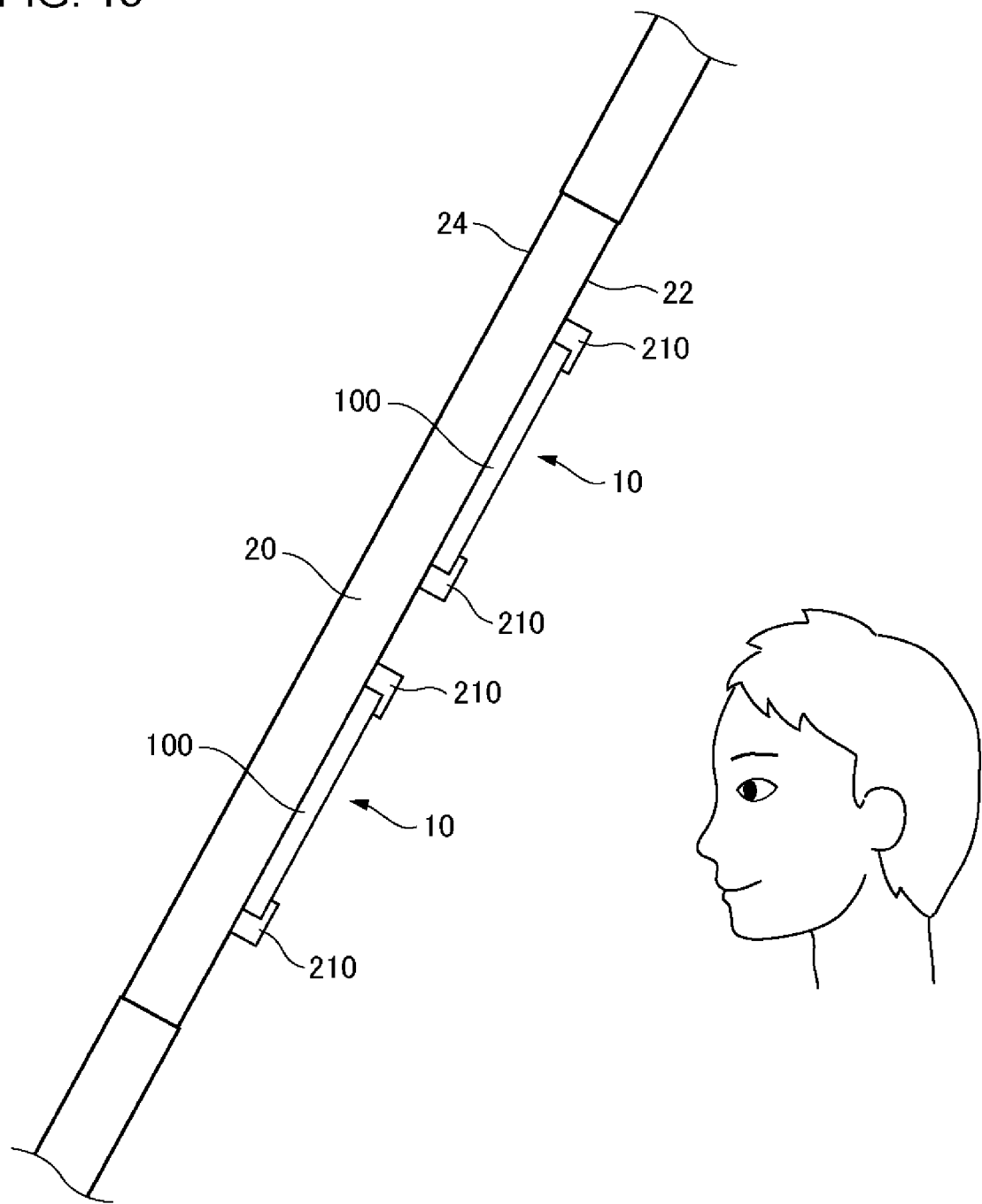
FIG. 15 is a cross-sectional view of a configuration of a light-emitting system according to Example 5.

FIG. 15 is a cross-sectional view of a configuration of a light-emitting device 10 according to Example 5. The light-emitting system according to the present example has the same configuration as the embodiment and each modification example and any of Examples 1 to 4, except that a plurality of light-emitting devices 10 are mounted on the partition member 20. Turning on and off of the lights of the plurality of light-emitting devices 10 may be controlled in accordance with control signals that are the same or different from each other.

In the present modification example also, the same as the embodiment, a possibility of light leakage to a rear surface side of the light-emitting device 10 can be reduced.

Example 6

Figure 16:
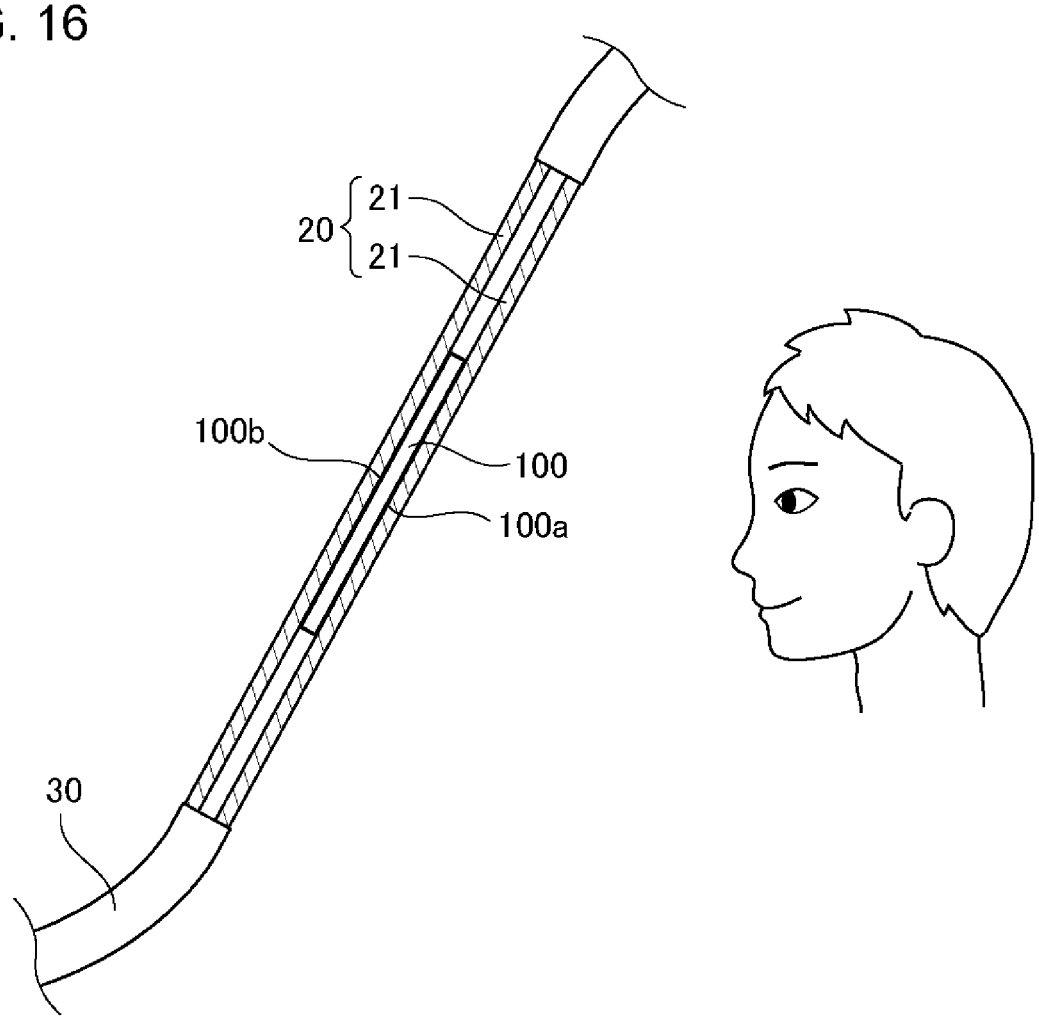
FIG. 16 is a cross-sectional view of a configuration of a light-emitting system according to Example 6.

FIG. 16 is a cross-sectional view of a configuration according to Example 6. The light-emitting system according to the present example has the same configuration as that of the light-emitting system according to Example 1, except for the configuration of the partition member 20 and the location of the light-emitting device 10.

In the present example, the partition member 20 has the configuration in which a plurality of light-transmitting members 21 (for example, glass plates or resin plates) overlap each other. Further, the light-emitting device 10 is installed in the partition member 20 by being interposed between the light-transmitting members 21 next to each other.

In the present example also, the same as Example 1, a possibility of light leakage to a rear surface side of the light-emitting device 10 can be reduced.

The embodiment and the examples are described above referring to the drawings, but these are examples of the present invention and various configurations other than those described above can be employed.

The invention claimed is:

1. A light-emitting device, comprising:
   a substrate having a first surface from which light is emitted and a second surface opposite the first surface;
   a plurality of light-emitting units on the second surface of the substrate, each light-emitting unit comprising a light-transmitting first electrode, a light-reflective second electrode, and an organic layer located between the first electrode and the second electrode, the first electrode, the organic layer, and the second electrode being laminated in this order from the substrate;
   a light-transmitting region located between the plurality of light-emitting units; and
   a sealing member that covers the plurality of light-emitting units and the light-transmitting region on the second surface of the substrate, the sealing member comprising:
      a first side faced to the plurality of light-emitting units and a second side opposite to the first side, and
      an intermediate layer that covers the first side, the intermediate layer contains particles comprising an inorganic material,
   wherein a roughness of the first side is higher than a roughness of the second side.

2. The light-emitting device according to claim 1, wherein the sealing member is fixed to at least one of a structure formed on the substrate and the substrate through an insulating layer.

* * * * *